(12) United States Patent
Masleid et al.

(10) Patent No.: US 8,943,375 B2
(45) Date of Patent: Jan. 27, 2015

(54) COMBO STATIC FLOP WITH FULL TEST

(75) Inventors: Robert P. Masleid, Monte Sereno, CA (US); Ali Vahidsafa, Palo Alto, CA (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 13/569,833

(22) Filed: Aug. 8, 2012

(65) Prior Publication Data

US 2014/0047284 A1    Feb. 13, 2014

(51) Int. Cl.
*G11C 29/32*    (2006.01)
*G11C 29/54*    (2006.01)

(52) U.S. Cl.
USPC .......................................... 714/718; 714/724

(58) Field of Classification Search
CPC ........... G11C 29/56; G01R 31/318536; G01R 31/318541; G01R 31/318555; G01R 31/318547; G01R 31/318552; G01R 31/31701
See application file for complete search history.

(56) References Cited

U.S. PATENT DOCUMENTS

2004/0239400 A1*   12/2004   Kunemund ................... 327/408
2011/0072326 A1*   3/2011   Vahidsafa et al. ............ 714/731

* cited by examiner

*Primary Examiner* — Ajay Bhatia
*Assistant Examiner* — Dipakkumar Gandhi
(74) *Attorney, Agent, or Firm* — Osha Liang LLP

(57) ABSTRACT

A SRAM (Static Random Access Memory) macro test flop circuit includes a flip-flop circuit, a scan control circuit, and an output buffer circuit. The flip-flop circuit includes a master latch circuit and a slave latch circuit. The master latch circuit includes a master storage node and a multiplexer. The slave latch circuit includes a slave storage node driven by the master latch. The scan control circuit includes a scan slave feed-forward circuit, a scan latch circuit, and a scan driver circuit driven by the scan feed-back circuit. The scan latch circuit includes a scan feed-back circuit, a scan storage node, and a scan feed-forward circuit driven from the slave latch. The output buffer circuit includes a master driver driven from the master latch circuit and a slave driver driven from the slave latch circuit.

23 Claims, 3 Drawing Sheets

COMBO STATIC FLOP WITH FULL TEST

BACKGROUND OF INVENTION

Flip-flops are widely used state elements that hold a particular state for a full clock cycle. A flip-flop consists of two latches connected serially, a master latch and a slave latch. The slave latch provides the flip-flop output. Thus, a scan function for test capability is provided by integrating a scan latch with the slave latch of flip-flop. In both a user mode and a test mode of operation, however, the output of master latch remains internal to the flip-flop.

SUMMARY OF INVENTION

In one or more embodiments, the present invention relates to SRAM (Static Random Access Memory) macro test flop circuit, driven by a source clock signal, comprising: a flip-flop circuit comprising: a master latch circuit comprising: a master storage node, and a multiplexer, wherein the multiplexer circuit provides a control signal for writing to the master storage node, and a slave latch circuit comprising: a slave storage node, and wherein the slave latch is operatively driven from the master latch, and wherein the master latch provides a control signal for writing to the slave storage node, a scan control circuit comprising: a scan slave feed-forward circuit providing a control signal for writing scan data to the slave storage node, a scan latch circuit comprising: a scan feed-back circuit comprising a scan storage node, a scan feed-forward circuit operatively driven from the slave latch, wherein the scan feed-forward circuit provides control signal for writing to the scan storage node, and a scan driver, with a scan output port, operatively driven by the scan feed-back circuit, and an output buffer circuit comprising: a master driver, with a master output port, operatively driven from the master latch, and a slave driver, with a slave output port, operatively driven from the slave latch.

In one or more embodiments, the present invention relates to a semiconductor device comprising: a mechanical package; and a semiconductor die comprising: a semiconductor layer, a plurality of metal layers, a clock distribution network that distributes a clock signal within the die, and a SRAM (Static Random Access Memory) macro test flop circuit, driven by a source clock signal, comprising: a flip-flop circuit comprising: a master latch circuit comprising: a master storage node, and a multiplexer, wherein the multiplexer circuit provides a control signal for writing to the master storage node, and a slave latch circuit comprising: a slave storage node, and wherein the slave latch is operatively driven from the master latch, and wherein the master latch provides a control signal for writing to the slave storage node, a scan control circuit comprising: a scan slave feed-forward circuit providing a control signal for writing scan data to the slave storage node, a scan latch circuit comprising: a scan feed-back circuit comprising a scan storage node, a scan feed-forward circuit operatively driven from the slave latch, wherein the scan feed-forward circuit provides control signal for writing to the scan storage node, and a scan driver, with a scan output port, operatively driven by the scan feed-back circuit, and an output buffer circuit comprising: a master driver, with a master output port, operatively driven from the master latch, and a slave driver, with a slave output port, operatively driven from the slave latch.

In one or more embodiments, the present invention relates to a system comprising: an input device; an output device; a mechanical chassis; a printed circuit board; and a semiconductor device comprising: a mechanical package; and a semiconductor die comprising: a semiconductor layer, a plurality of metal layers, a clock distribution network that distributes a clock signal within the die, and a SRAM (Static Random Access Memory) macro test flop circuit, driven by a source clock signal, comprising: a flip-flop circuit comprising: a master latch circuit comprising: a master storage node, and a multiplexer, wherein the multiplexer circuit provides a control signal for writing to the master storage node, and a slave latch circuit comprising: a slave storage node, and wherein the slave latch is operatively driven from the master latch, and wherein the master latch provides a control signal for writing to the slave storage node, a scan control circuit comprising: a scan slave feed-forward circuit providing a control signal for writing scan data to the slave storage node, a scan latch circuit comprising: a scan feed-back circuit comprising a scan storage node, a scan feed-forward circuit operatively driven from the slave latch, wherein the scan feed-forward circuit provides control signal for writing to the scan storage node, and a scan driver, with a scan output port, operatively driven by the scan feed-back circuit, and an output buffer circuit comprising: a master driver, with a master output port, operatively driven from the master latch, and a slave driver, with a slave output port, operatively driven from the slave latch.

DETAILED DESCRIPTION

Figure 1:
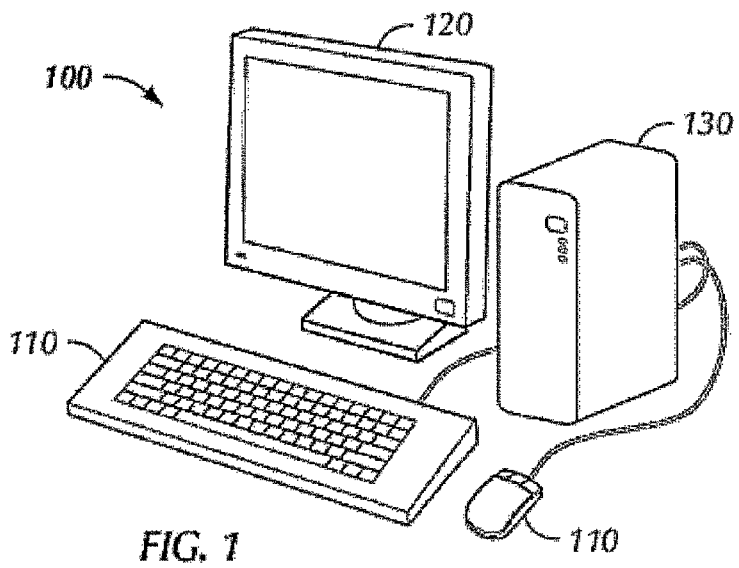
FIG. 1 shows a system in accordance with one or more embodiments of the present invention.

Specific embodiments of the present invention will now be described in detail with reference to the accompanying figures. Like elements in the various figures are denoted by like reference numerals for consistency. Further, in the following detailed description of embodiments of the present invention, numerous specific details are set forth in order to provide a more thorough understanding of the present invention. In other instances, well-known features have not been described in detail to avoid obscuring the description of embodiments of the present invention.

FIG. 1 shows a system in accordance with one or more embodiments of the present invention. A system 100 includes input devices 110, an output device 120, and a mechanical chassis 130. The mechanical chassis 130 includes a printed circuit board ("PCB"), a network device, and a storage device (not shown).

Figure 2:
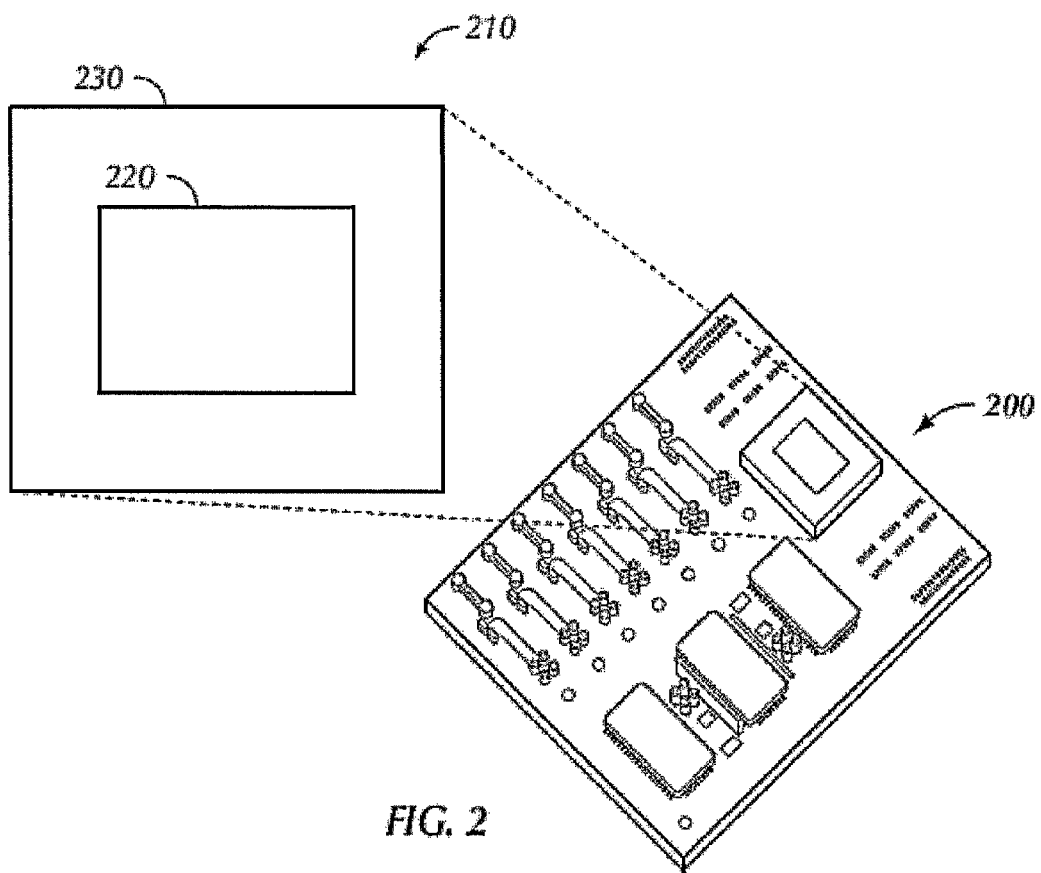
FIG. 2 shows a printed circuit board that includes one or more semiconductor device(s) that each includes one or more semiconductor die in accordance with one or more embodiments of the present invention.

FIG. 2 shows a printed circuit board that includes one or more semiconductor device(s) that each include one or more semiconductor die in accordance with one or more embodiments of the present invention. The PCB 200 may be included in system 100 of FIG. 1 and includes one or more semiconductor device(s) 210. Each semiconductor device 210 includes one or more semiconductor die 220 encapsulated in a mechanical package 230. The mechanical package 230 serves as an electrical and mechanical interface between the die 220 and the PCB 200.

The PCB 200 provides one or more external clock signals to the semiconductor device 210. The mechanical package 230 provides the external clock signal(s) to the die 220. The die 220 is comprised of a plurality of metal layers and a semiconductor layer. The die 220 generates one or more internal clock signals that are a function of the provided external clock signal(s). The internal clock signals are typically the most heavily loaded, the most widely distributed, and the fastest signals within the die 220. Clock distribution networks are used to provide the clock signals to the proper loads within the die 220.

The clock distribution network is organized as a hierarchy of three functional layers that distribute the clock within the semiconductor die: the tree layer, the grid layer, and the local layer. The tree layer includes a fractal clock tree that spans a large area of the die. The grid layer includes clock routes to the individual clock users via a clock grid. The local layer includes clock routes to the actual flip-flops.

A typical flip-flop has slave latch output as the flip-flop output, whereas master latch output stays inside the flip-flop. The special testing requirement of SRAM (Static Random Access Memory) requires that master latch output be available outside the flip-flop. Thus, a flip-flop for special SRAM testing has two outputs, the master latch output for testing and the slave latch output for user operation. Because the master latch output is a test port, the scan and/or test data is loaded to the master latch for testing.

Figure 3:
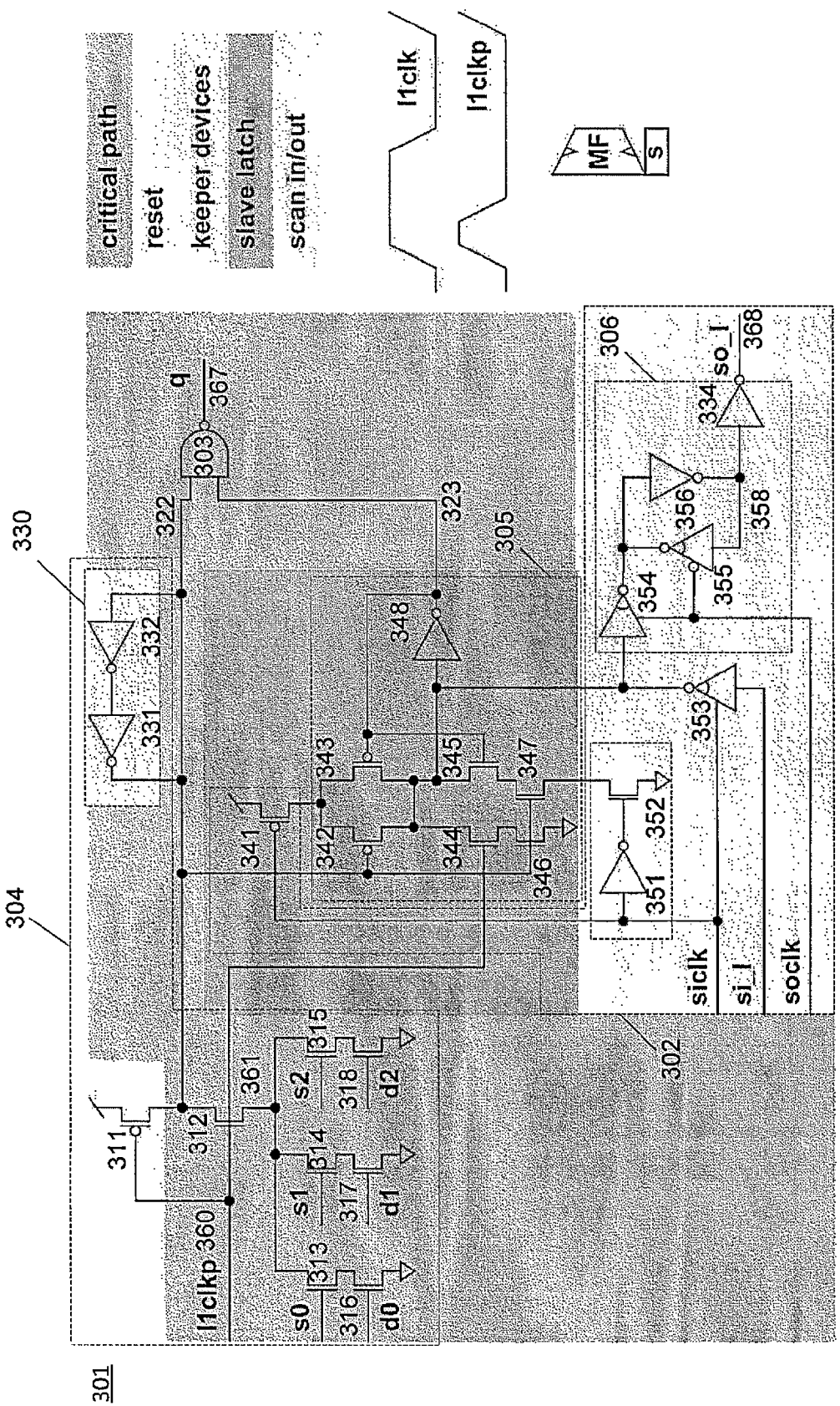
FIG. 3 shows a first SRAM macro test flop in accordance with one or more embodiments of the present invention.

FIG. 3 shows a first SRAM macro test flop 300 in accordance with one or more embodiments of the present invention. The first SRAM macro test flop 300 consists of three major blocks, flip-flop 301, scan control 302, and an output buffer 303. The output buffer 303 contains two drivers (master driver 322 and slave driver 323) to provide outputs respectively from master latch and slave latch of the flip-flop. The output from the master latch is fed as an input to the master driver 322. The output from the slave latch is fed as an input to the slave driver 323. The master driver 322 and the slave driver 323 feed Q 367 as the output from the flip-flop.

The flip-flop 301 is driven by a clock signal, CLK 360, and a muxed data-in signal, D 361. The muxed data signal, D 361, comprises inputs D0, D1, and D2. The muxed data signal, D 361, further comprising selection inputs S0, S1, and S2. The flip-flop is comprised of n-channel field effect transistors ("N-FETs"), p-channel field effect transistors ('P-FETs"), and inverters. The flip-flop 301 consists of two main components, a master latch 304 and a slave latch 305.

The master latch 304 comprises P-FET 311, N-FET 312, N-FET 313, N-FET 314, N-FET 315, N-FET 316, N-FET 317, N-FET 318, and keeper devices 330 including inverter 331 and inverter 332. The output of the master latch 304 is fed to the master driver 322 and the slave latch 305.

The slave latch 305 comprises P-FET 342, P-FET 343, N-FET 344, N-FET 345, N-FET 346, N-FET 347, and inverter 348. The output of the slave latch 305 is fed to the slave driver 323.

The scan control 302 is integrated with flip-flop 301 for test capability. The scan control 302 comprises scan latch 306, inverter 351, N-FET 352, P-FET 341, and tri-state inverter 353. The scan latch comprises tri-state inverter 354, tri-state inverter 355, inverter 356, and scan driver 334. The scan storage node 358 drives the input of scan driver 334, where the output of scan driver 334 is scan out signal SO 368. The SO 368 signal is available outside the first SRAM macro test flop 300 for test mode. The SRAM testing requires that test data (e.g., scan data) be loaded into the slave latch 305 of flip-flop 301. This is accomplished in 3 steps, scan-in step to load scan data to slave latch 305, scan-out step to transfer the data loaded into slave latch 305 to scan latch 306, and run step to load the data from master latch 304 to slave latch 305.

The master latch 304 has two modes of operation, a transparent mode and a hold mode. In the transparent mode, CLK 360 is at a high logic state and data-in signal at D 361 is transmitted through the master latch 304 to the output of master latch 304. In the hold mode, CLK 360 is at a low logic state and the master latch 304 maintains the previous logic state. The master output 322 is the output from master latch 304 of the flip-flop 301.

In the transparent mode of master latch 304, P-FET 311 is disabled with CLK 360 at a pulse high logic state. It is well known in the art that P-FET is disabled with a high logic state on the gate of P-FET. The N-FET 316, N-FET 317, or N-FET 318, are enabled for the case of data-in D0, D1, or D2 respectively at high logic state. Additionally, N-FET 313, N-FET 314, or N-FET 315, are enabled for the case of selection inputs S0, S1, or S2 respectively at high logic state. Under these conditions of CLK 360 at high logic state and either of D0 and S0, D1 and S1, or D2 and S2 at high logic state, a low logic state is written by a pull-down path to ground through N-FET 312. During a subsequent hold mode with CLK 360 at a low logic state, the previously written low logic state will be precharged and cleared.

The slave latch 305 comprises P-FET 342, P-FET 343, N-FET 344, N-FET 345, N-FET 346, N-FET 347, and inverter 348. The output of the slave latch 305 is fed to the slave driver 323.

The slave latch 305 also has two modes of operation, a transparent mode and a hold mode. In the transparent mode, CLK 360 is at a high logic state and data from master latch 304 is transmitted through the slave latch 305 to the output of slave latch 305. In the hold mode, CLK 360 is at a low logic state and the slave latch 305 maintains the previously written logic state. The slave latch 305 provides input to the slave driver 323, with output of slave driver 323 driving Q 367 which is the output from slave latch 305 and master latch 304 forming the output of the flip-flop 301.

In the transparent mode of slave latch 305, N-FET 344 is enabled with CLK 360 at a high logic state. It is well known in the art that N-FET is enabled with a high logic state on the gate of N-FET. The N-FET 346 is enabled for the case of master latch 304 at low logic state. Under these conditions of CLK 360 at high logic state and master storage node 322 at high logic state, a low logic state is written by a pull-down path to ground through N-FET 346 and N-FET 344. During a subsequent hold mode with CLK 360 at a low logic state, slave latch 305 will maintain the previously written low logic state.

The flip-flop 301 can now be described based upon the master latch 304 and slave latch 305 described above. During CLK 360 at pulse high logic state, data-in at D 361 is written to the master latch 304. But during CLK 360 at a low logic state, slave latch 305 is in hold state and is thus blocked from receiving new data. During subsequent CLK 360 at low logic state, the master latch 304 is in hold state and erases the previously written data with precharge. But with CLK 360 in pulse high logic state, slave latch 305 is in transparent mode and previous stored data at master latch 304 is transmitted through slave latch 305 and slave driver 323 to slave output Q 367. During the next clock phase with CLK 360 at low logic state, master latch 304 will be in precharge mode and ready to receive new data. The slave output data at Q 367 may change once every cycle, on a low to high transition edge of the clock CLK 360. It will be obvious to those skilled in the art, that other embodiments can be easily derived with output data changing on a high to low transition edge of the clock. Accordingly, the specific arrangement of components shown in FIG. 3 should be considered as merely one example of an embodiment of the present invention.

Figure 4:
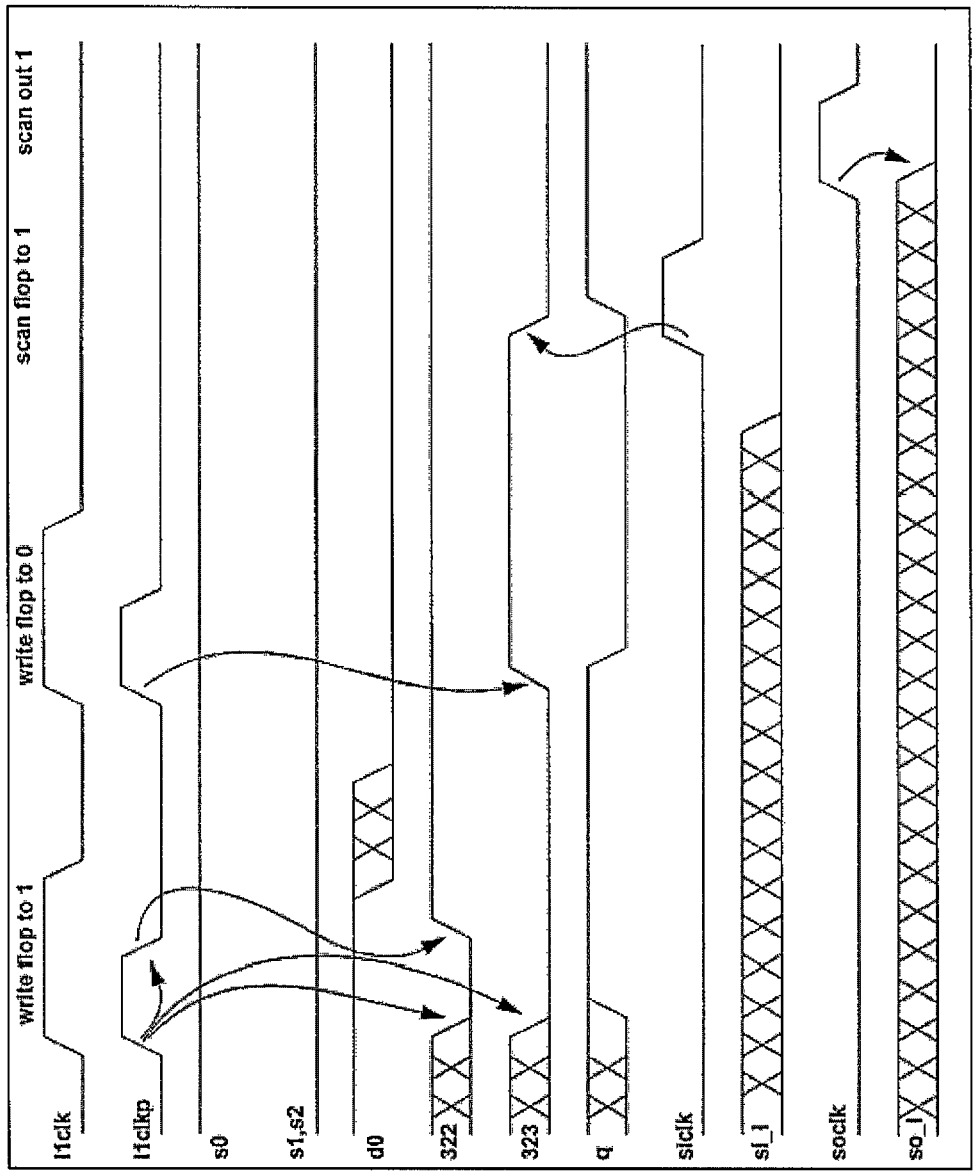
FIG. 4 shows a waveform in accordance with one or more embodiments of the present invention.

FIG. 4 shows a waveform in accordance with one or more embodiments of the present invention. In FIG. 4, L1CLK is the main clock and L1CLKP is the pulse of the main clock. A data signal from D0, D1, or D2, is selected by respective selection signals S0, S1, and S2. It will be obvious to those skilled in the art that, in the example shown, only data input from data signal D0 is depicted. Accordingly, the specific arrangement of signals shown in FIG. 4 should be considered as merely one example of an embodiment of the present invention.

With S0 asserted high to select data signal D0, the signal D0 is written to the master latch when L1CLKP pulses high. Additionally, when L1CLKP pulses high, the data from the master latch is written to the slave latch from the master driver 322. When the clock L1CLKP goes low, the slave latch holds its state as seen at the slave driver 323. Further, when clock L1CLKP goes low, the master latch is pre-charged. The slave driver can also be written to by the scan in. Scan load signal SI_L is written to the slave latch when scan in clock SICLK is pulsed high.

The scan latch can be written to by the slave latch. The slave latch signal at the slave driver 323 is written to the scan latch when scan out clock SOCLK is pulsed high. The resulting signal stored in the scan latch can then be seen through the scan out load SO_L.

It will be obvious to one skilled in the art that the flip-flop output Q is the result of master driver 322 and slave driver 323 being fed through a NAND gate as depicted to describe the present invention. Additionally, while the timing in FIG. 4 is explained for illustration, it will be obvious to those skilled in the art, that other embodiments with different signal timing can easily be derived without deviating from the spirit of the present invention. Accordingly, the specific arrangement of signals shown in FIG. 4 should be considered as merely one example of an embodiment of the present invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A SRAM (Static Random Access Memory) macro test flop circuit, driven by a source clock signal, comprising:
    a flip-flop circuit comprising:
        a master latch circuit comprising:
            a master storage node, and
            a three to one multiplexer with a first data-in, a second data-in, and a third data-in as three multiplexer inputs, wherein the multiplexer output provides a control signal for writing to the master storage node, and
        a slave latch circuit comprising:
            a slave storage node, and
            wherein the slave latch is operatively driven from the master latch, and
            wherein the master latch provides a control signal for writing to the slave storage node,
            wherein the master latch is precharged while data is preserved in the slave latch until a next clock cycle,
    a scan control circuit comprising:
        a scan slave feed-forward circuit providing a control signal for writing scan data to the slave storage node,
        a scan latch circuit comprising:
            a scan feed-back circuit comprising a scan storage node,
            a scan feed-forward circuit operatively driven from the slave latch, wherein the scan feed-forward circuit provides control signal for writing to the scan storage node, and
            a scan driver, with a scan output port, operatively driven by the scan feed-back circuit, and
        an output buffer circuit.

2. The SRAM macro test flop circuit of claim 1, the scan control circuit further comprising:
    a scan master feed-forward circuit operatively driven from the scan latch, wherein the scan master feed-forward circuit provides control signal for writing to the master storage node.

3. The SRAM macro test flop circuit of claim 1, wherein a single polarity of the source clock signal is used in the SRAM macro test flop circuit.

4. The SRAM macro test flop circuit of claim 1, the three to one multiplexer further comprising:
    a first selection-in, a second selection-in, and a third selection-in as three selection inputs, wherein the three selection inputs provide control signals determining which data-in input is written to the master storage node.

5. The SRAM macro test flop circuit of claim 1, wherein the output buffer circuit comprises:
    a master driver, with a master output port, operatively driven from the master latch, and
    a slave driver, with a slave output port, operatively driven from the slave latch.

6. The SRAM macro test flop circuit of claim 5, the master driver further comprising: a keeper device with a first inverter and a second inverter.

7. The SRAM macro test flop circuit of claim 1, wherein the output buffer circuit comprises:
    a single output port, operatively driven by a combination of
        a slave driver, operatively driven from the slave latch, and
        a master driver, operatively driven from the master latch.

8. The SRAM macro test flop circuit of claim 1, wherein the source clock signal is the pulse of a main clock.

9. A semiconductor device comprising:
    a mechanical package; and
    a semiconductor die comprising:
        a semiconductor layer,
        a plurality of metal layers,
        a clock distribution network that distributes a clock signal within the die, and
        a SRAM (Static Random Access Memory) macro test flop circuit, driven by a source clock signal, comprising:
            a flip-flop circuit comprising:
                a master latch circuit comprising:
                    a master storage node, and
                    a three to one multiplexer with a first data-in, a second data-in, and a third data-in as three multiplexer inputs, wherein the multiplexer output provides a control signal for writing to the master storage node, and
                a slave latch circuit comprising:
                    a slave storage node, and
                    wherein the slave latch is operatively driven from the master latch, and
                    wherein the master latch provides a control signal for writing to the slave storage node, wherein the master latch is precharged while data is preserved in the slave latch until a next clock cycle,
a scan control circuit comprising:
a scan slave feed-forward circuit providing a control signal for writing scan data to the slave storage node,
a scan latch circuit comprising:
a scan feed-back circuit comprising a scan storage node,
a scan feed-forward circuit operatively driven from the slave latch, wherein the scan feed-forward circuit provides control signal for writing to the scan storage node, and
a scan driver, with a scan output port, operatively driven by the scan feed-back circuit, and
an output buffer circuit.

10. The semiconductor device of claim 9, the scan control circuit further comprising:
a scan master feed-forward circuit operatively driven from the scan latch, wherein the scan master feed-forward circuit provides control signal for writing to the master storage node.

11. The semiconductor device of claim 9, wherein a single polarity of the source clock signal is used in the SRAM macro test flop circuit.

12. The semiconductor device of claim 9, the three to one multiplexer further comprising:
a first selection-in, a second selection-in, and a third selection-in as three selection inputs, wherein the three selection inputs provide control signals determining which data-in input is written to the master storage node.

13. The semiconductor device of claim 9, wherein the output buffer circuit-comprises:
a master driver, with a master output port, operatively driven from the master latch, and
a slave driver, with a slave output port, operatively driven from the slave latch.

14. The semiconductor device of claim 13, the master driver further comprising: a keeper device with a first inverter and a second inverter.

15. The semiconductor device of claim 9, wherein the output buffer circuit-comprises:
a single output port, operatively driven by a combination of
a slave driver, operatively driven from the slave latch, and
a master driver, operatively driven from the master latch.

16. The semiconductor device of claim 9, wherein the source clock signal is the pulse of a main clock.

17. A system comprising:
an input device;
an output device;
a mechanical chassis;
a printed circuit board; and
a semiconductor device comprising:
a mechanical package; and
a semiconductor die comprising:
a semiconductor layer,
a plurality of metal layers,
a clock distribution network that distributes a clock signal within the die, and
a SRAM (Static Random Access Memory) macro test flop circuit, driven by a source clock signal, comprising:
a flip-flop circuit comprising:
a master latch circuit comprising:
a master storage node, and
a three to one multiplexer with a first data-in, a second data-in, and a third data-in as three multiplexer inputs, wherein the multiplexer output provides a control signal for writing to the master storage node, and
a slave latch circuit comprising:
a slave storage node, and
wherein the slave latch is operatively driven from the master latch, and
wherein the master latch provides a control signal for writing to the slave storage node,
wherein the master latch is precharged while data is preserved in the slave latch until a next clock cycle,
a scan control circuit comprising:
a scan slave feed-forward circuit providing a control signal for writing scan data to the slave storage node,
a scan latch circuit comprising:
a scan feed-back circuit comprising a scan storage node,
a scan feed-forward circuit operatively driven from the slave latch, wherein the scan feed-forward circuit provides control signal for writing to the scan storage node, and
a scan driver, with a scan output port, operatively driven by the scan feed-back circuit, and
an output buffer circuit.

18. The system of claim 17, wherein a single polarity of the source clock signal is used in the SRAM macro test flop circuit.

19. The system of claim 17, the three to one multiplexer further comprising:
a first selection-in, a second selection-in, and a third selection-in as three selection inputs, wherein the three selection inputs provide control signals determining which data-in input is written to the master storage node.

20. The system of claim 17, wherein the output buffer circuit-comprises:
a master driver, with a master output port, operatively driven from the master latch, and
a slave driver, with a slave output port, operatively driven from the slave latch.

21. The system of claim 20, the master driver further comprising:
a keeper device with a first inverter and a second inverter.

22. The system of claim 17, wherein the output buffer circuit-comprises:
a single output port, operatively driven by a combination of
a slave driver, operatively driven from the slave latch, and
a master driver, operatively driven from the master latch.

23. The system of claim 17, wherein the source clock signal is the pulse of a main clock.

* * * * *